United States Patent
Piloni et al.

(10) Patent No.: US 6,389,274 B1
(45) Date of Patent: May 14, 2002

(54) SUBHARMONIC FREQUENCY CONVERTER FOR APPLICATIONS TO MILLIMETRIC RADIO WAVES

(75) Inventors: Marco Piloni, Vimodrone; Fulvio Cattaneo, Carate Brianza, both of (IT)

(73) Assignee: Italtel SPA, Milan (IT)

( * ) Notice: Subject to any disclaimer, the term of this patent is extended or adjusted under 35 U.S.C. 154(b) by 0 days.

(21) Appl. No.: 09/202,421

(22) PCT Filed: Jun. 11, 1997

(86) PCT No.: PCT/EP97/03068

§ 371 Date: May 21, 1999

§ 102(e) Date: May 21, 1999

(87) PCT Pub. No.: WO97/49173

PCT Pub. Date: Dec. 24, 1997

(30) Foreign Application Priority Data

Jun. 18, 1996 (IT) .......................................... MI96A1227

(51) Int. Cl.[7] ................................................. H04B 1/26
(52) U.S. Cl. ........................ 455/325; 455/327; 455/330
(58) Field of Search ................................ 455/323, 325, 455/326, 327, 328, 330

(56) References Cited

U.S. PATENT DOCUMENTS

| 4,215,313 A | * | 7/1980 | Chang et al. ................ 455/326 |
| 4,320,536 A | * | 3/1982 | Dietrich ...................... 455/325 |
| 4,679,249 A | | 7/1987 | Tanaka et al. |
| 4,742,571 A | * | 5/1988 | Letron ........................ 455/327 |
| 4,864,645 A | * | 9/1989 | Dixon, Jr. et al. ........... 455/327 |
| 4,955,079 A | * | 9/1990 | Connerney et al. ......... 455/325 |
| 5,640,700 A | * | 6/1997 | Shingyoji et al. ........... 455/328 |

OTHER PUBLICATIONS

Journess Nationales Microondes Montpellier, Juin 21–23, 1989, No. 6 (3 pages).

C. Nguyen et al.: Electronics Letters., vol. 20, No. 11, May 1984, p. 441.

* cited by examiner

*Primary Examiner*—Daniel Hunter
*Assistant Examiner*—Alan Gantt

(57) ABSTRACT

A frequency converter that includes a first low-pass filter and a band-pass filter with a first end operatively connected to a first end of the first low-pass filter. The frequency converter also includes a second low-pass filter with a first end also operatively connected to the first end of the first low-pass filter. The frequency converter, moreover, includes a first waveguide with a first end operatively connected to a second end of the second low-pass filter, with the first waveguide containing at least one frequency-mixing element, and with the first waveguide continuing for a specific length after the one frequency-mixing element and having a second end that is operatively short circuited. The frequency converter, furthermore, includes a second waveguide operatively connected to the one frequency-mixing element. The frequency converter is arranged such that the specific length of the first waveguide extends past the operative connection between the second waveguide and the one frequency-mixing element.

20 Claims, 2 Drawing Sheets

SUBHARMONIC FREQUENCY CONVERTER FOR APPLICATIONS TO MILLIMETRIC RADIO WAVES

This application is the national phase under 35 U.S.C. §371 of prior PCT International Application No. PCT/EP97/03068 which has an International filing date of Jun. 6, 1997 which designated the United States of America.

FIELD OF THE INVENTION

The present invention relates to the sector of transmitting and receiving microwave signals, and more precisely to a subharmonic frequency converter for applications to the millimetric radio waves.

In the range of the millimetric radio waves concerning frequencies from 30 GHz upwards it is possible to realize very compact and miniaturized frequency converters, thanks also to the reduced dimensions of the cross sections of the rectangular waveguides interconnecting with those.

This type of converters are generally realized in thin film, and the layers are put into metal packages. The frequency conversion is carried out by mixer diodes. A problem coming up regarding the propagation of the radiofrequency signal from the waveguide to the diodes, and vice versa, is that of carrying out a transition between the metallic waveguide and the circuit in microstrip connected to the diodes.

BACKGROUND ART

A first known solution for this problem consists in the introduction into the guide of an end of a small cylindric conductor which other end is welded to the microstrip, as for example disclosed in the U.S. Pat. No. 4,679,249 patent document. In the frequency converter of the citation the above-mentioned conductor operates as an antenna in the guide and transfers the here present radiofrequency signal to the microstrip, or vice versa.

The U.S. Pat. No. 4,955,079 patent document discloses a waveguide excited subharmonic mixer with image rejection realized in thin film technology. As known a subharmonic converter is generally based on a couple of mixer diodes connected each other in antiparallel and forming a single-ended structure unbalanced to ground as regards both the RF and local oscillator signals.

The original embodiment of the second mixer utilizes the dielectric substrate of the thin film circuit for mechanically supporting the RF waveguide, providing in the meanwhile means for including the pair of diodes inside the cavity of the waveguide. Because the radiofrequency signal directly illuminates the mixer diodes inside the waveguide, the additional guide to microstrip transition means employed in the converter of the first citation is now avoided. For the aims of above the dielectric substrate includes a rectangular groove extending through all the thickness of the substrate and partially encircle the pair of diodes. The end rim of the radiofrequency waveguide is inserted in the groove and firmly grounded on the backside of the substrate. The RF rectangular waveguide is mounted on the front side of the dielectric substrate (slab) by forcing against the substrate a peripheral metallic flange belonging to the same waveguide. A second short tract of RF rectangular waveguide is mounted on the back side of the slab opposite the former waveguide for the purpose of furnishing a proper termination for the RF signal beyond the diodes. The back waveguide tract has a second metallic flange forced against both the ground plane and the rim of the former waveguide out of the grooves, by screwing each other the two flanges. A portion of the ground plane is without metallization in correspondence of a rectangular area inside the back waveguide tract. A very small line is provided which departs from one end of a pair of diodes and prosecutes through the internal side of the rectangular groove towards the ground plane on the backside.

It is all evident from the above description the complexity of the means provided for coupling the RF waveguide to the pairs of unbalanced diodes and the weakness of the resulting structure. In particular the rectangular groove and the further four holes necessary to secure the rectangular flanges increase the risk of breaking the substrate in the included area. Besides a metallic RF waveguide anchored to a rigid and breakable dielectric substrate, it doesn't resemble a good design. In fact if employing the converter in particular hazardous environments such as military or on board satellite, the strong mechanical vibrations that the elongate RF waveguide communicates to the dielectric substrate can easily break the latter.

Another drawback is that the technical solution for grounding the diodes doesn't appear sufficiently reliable because of the difficulty to perform a so small and particular metallization which could easily undergo breaking or detach during the operating life of the converter.

Furthermore from the thin film circuit a spurious radiation can propagate in the free space around and disturb the other circuits of the communication apparatus including the mixer. The vice versa is also true.

In the end the groove around the diodes for the rim insertion of the front RF waveguide requires the use of expensive drilling means, such as an ultrasonic drill or a $CO_2$ laser. This type of drilling is a burden operation in a large scale production.

SUMMARY OF THE INVENTION

Accordingly the purpose of the present invention is to overcome the above drawbacks and indicate a microwave subharmonic frequency converter in single-ended configuration having such a good mechanical stability, reliability, and protection against spurious radiation to render it particularly useful for the employment in environments characterized both by strong vibrations and low noise requirements, such as on board satellite.

To achieve said purposes the object of the present invention is a microwave subharmonic frequency converter with the features of the claim 1.

In particular, the mechanical stability and protection against spurious radiation are both reached by lodging and securing the dielectric substrate supporting the thin film converter thoroughly inside cavities of a metal body closed with a metal plate. Among these cavities a first one, which includes a diplexer and a low pass filters, is not to be considered as an effective electromagnetic resonating cavity but more properly a cavity for reaching the purposes stated above, while a second one including the diodes is a true RF resonating cavity which extends to a RF waveguide fixed to the metal body. A third small additional cavity extends the first cavity beyond the second one for the only purpose of grounding the diodes without directly contacting the internal walls of the RF resonating cavity, in that preventing a possible anomalous propagation of the RF signal and the level increasing of the spurious propagation mode.

BRIEF DESCRIPTION OF THE DRAWINGS

The feature of the present invention which are believed to be novel are set fort with particularity in the appended claims.

The invention, together with further objects and advantages thereof, may be understood with reference to the following description taken in conjunction with the accompanying drawings, and the several figures of which like referenced numerals identify like elements, and in which:

Referring to FIG. 1 the here shown microwave frequency converter of the subharmonic type is set up by a metallic body I with a configuration of a parallelepipedon in which three cavities have been realized communicating among them. A first cavity has a rectangular section, the longest dimension of said section is perpendicular to an axis A—A of horizontal symmetry of the metallic body. Cavity 2 communicated with a narrower and longer rectangular cavity 3 set along the same Axis A—A. The latter communicates at its turn with a third and larger rectangular cavity the cavities and turn out to be symmetric compared to axis A—A, which is not the case of cavity 4 which extends towards an edge of body 1. Cavity 2 passes through the entire thickness of the metallic body 1, while the cavities 3 and 4 finish at approximately half of the thickness. Cavity 3 continues fort a short way 3, beyond cavity 2.

Figure 1:
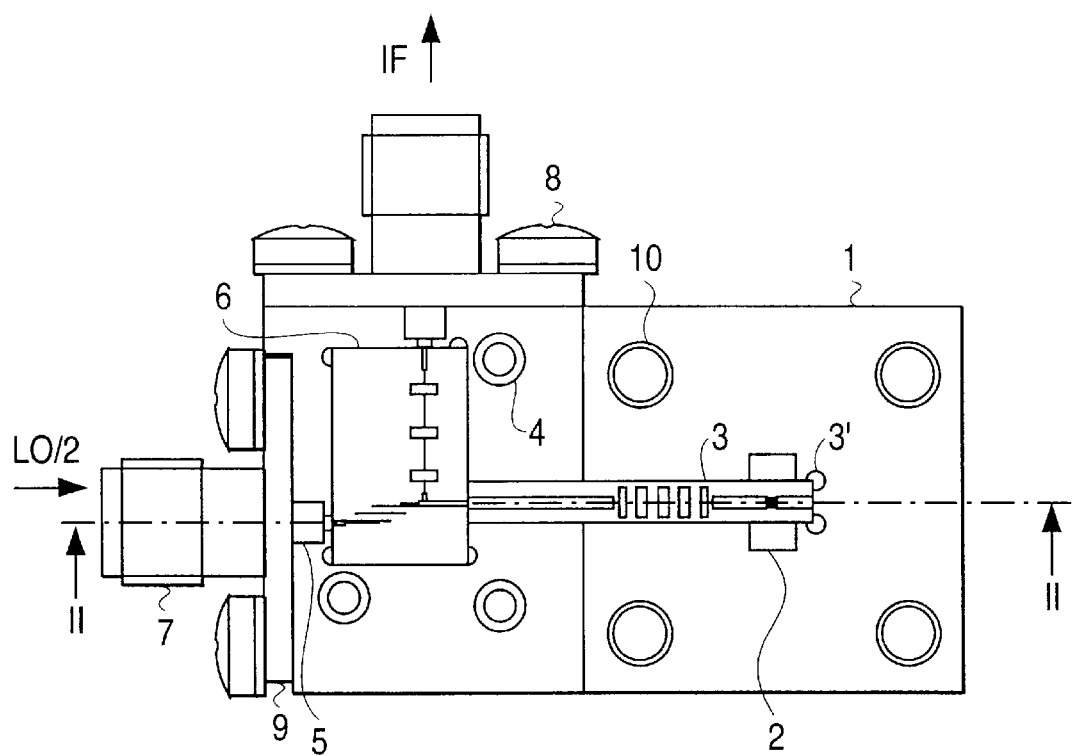
FIG. 1 shows a perspective view of the subharmonic frequency converter as the object of the present invention.

Two perpendicular to each other sidewalls of body 1 are perforated in correspondence to cavity 4 in order to receive two cylindric glass feedthroughs 5 and 6 called hereafter glass-beads. The latter are at their turn connected to two coaxial connectors 7 and 8 concentric to the glass-beads 5 and 6 which penetrate into respective metal supports 9 and 10 screwed on the sides of the metallic body 1.

Figure 3:
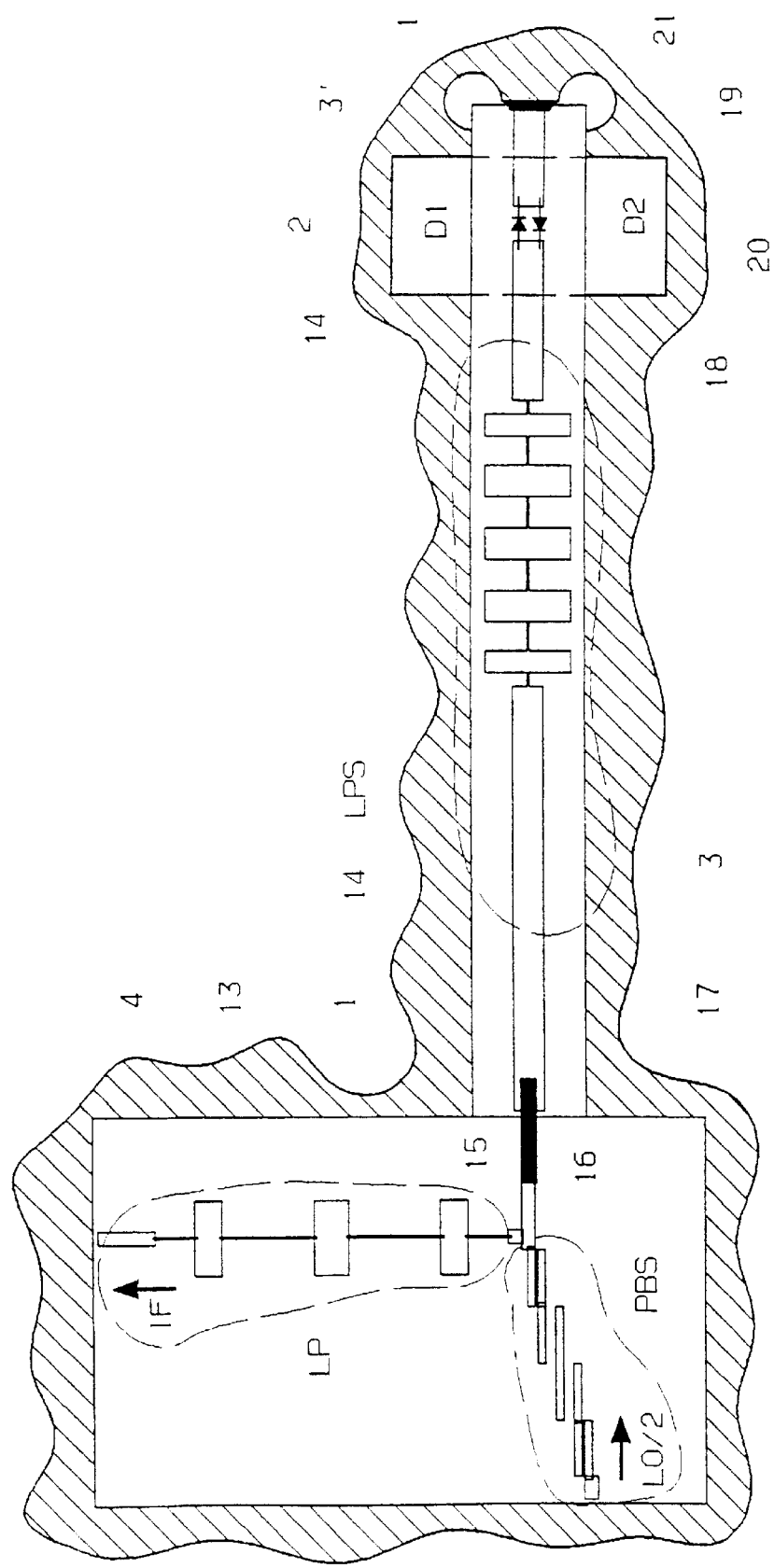
FIG. 3, indicated in a more detailed way the central part of FIG. 1 related to the layout in thin film.

The cavities 2, 3 and 4 contain the circuit par in thin film of the converter, which will be illustrated when examining FIG. 3. At connector 7 arrives a local oscillator signal LO/2 and from connector 8 comes out an intermediate frequency signal IF.

Figure 2:
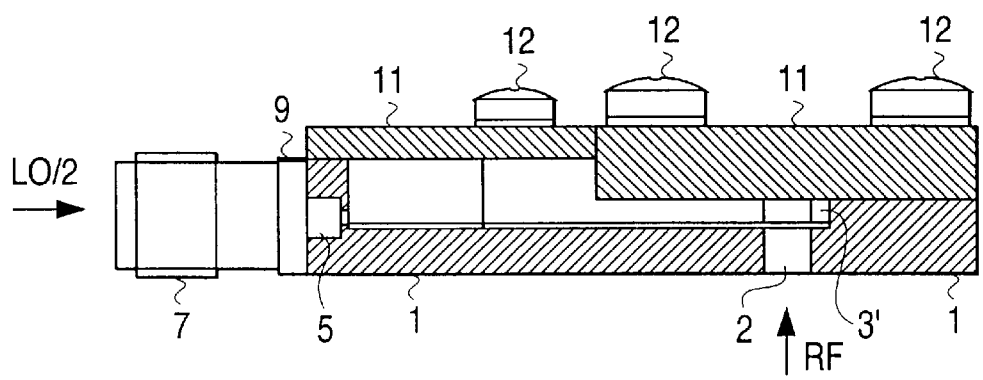
FIG. 2 shows a section view according to plane II—II (also referred to as A—A of) FIG. 1.

Referring to FIG. 2 in which the same elements of FIG. 1 are indicated by the same symbols, we can see the metal body 1 and the cavities 2, 3 and 4 sectioned along a plane cutting perpendicularly the body 1 along the centre line A—A. The upper part of the cavities 2, 3 and 4 are closed by a metal plate 11 fixed to the body 1 by screws 12.

In the lower part of cavity 2 a radiofrequency signal RF in reception is indicated which enters cavity 2.

For simplicity reasons the FIG. 1 and 2 do not show a metallic flange fixed by screws to the lower part of the body 1. The flange supports a rectangular waveguide (also this is not shown in the fig.) which communicates with cavity 2 where the radiofrequency signal RF converges.

Referring to FIG. 3 in which the same elements of the FIGS. 1 and 2 are indicated by the same symbols, it is possible to notice that an alumina layer 13 is placed in cavity 4. A second quartz layer 14 is placed in cavity 3 where it extends for the whole length of this one, passes through the central zone of cavity 2 and ends in the part 3' which extends cavity 3 beyond cavity 2. The ground planes of the backside of the layers 13 and 14 are welded by thermal compression to the metallic body 1.

Layer 13 supports a diplexer filter set up by a pass-band section PBS and by a low pass section LP. One end of the pass-band section PBS is connected to the glass-bead 5, and therefore to the coaxial connector 7 of the local oscillator signal LO/2 (shown in FIG. 1); the second end of the section PSB is connected to a short microstrip 15 put along the axis A—A of FIG. 1 and ending near the alumina layer 13. One end of the low pass section LP is connected to the glass-bead 6, and therefore to the coaxial connector 8 of the intermediate frequency signal IF (shown in FIG. 1); the second end of the section LP is also connected to the microstrip 15 in the same point in which the second end of the pass-band section PBS is connected. The filters PBS and LP are realized in microstrips according to known techniques, the filter PBS comprises a block for the direct current set up by two short lines of which one is connected to microstrip 15.

The quartz layer 15 supports a low pass filter LPS realized in microstrip according to known techniques. To both ends of the filter LPS, which correspond to the same number of ports for the signals, two microstrips 17 and 18 are present. A metal strap 16 interconnects the short microstrip 15 of the diplexer filter with the microstrip 17 of the filter LPS. The microstrip 18 at the other end of LPS is connected to a head of a pair of mixer diodes D1 and D2 put in antiparallel, the other head of which is connected to a short microstrip 19 which extends inside the part 3' which extends cavity 3 beyond cavity 2. The metallization of the ground plan present on the backside of layer 14 is interrupted in cavity 2 just next to zone 20 (indicated by hatching). Microstrip 19 is connected to the metal body 1 by a welding 21. Summarizing the microstrips 18 and 19 inside the cavity 2 are equivalent to a single line passing through the cavity 2 along the centre line in the sense of the shortest dimension, the above-mentioned line is interrupted in one zone in the centre of the cavity where the diodes D1 and D2 are placed in antiparallel connected between the heads of the interruption.

As already said before, to the lower side of the metal body 1 a rectangular waveguide (not shown) is rigidly connected facing cavity 2 with which it communicates. The latter one is in reality a part of the above-mentioned waveguide closed at the upper end by the metal plate 11 which for said cavity 2 represents a short-circuit plate 11 in all respects (FIG. 2). The shortest dimension of the rectangular section of cavity 2 is smaller than that of the rectangular guide which converges the signal RF (cavity in reduced height guidance) in order to avoid power losses and so losses of conversion due to the impedance missmatching between guide and cavity.

Referring to the previous figures to illustrate the functioning of the converter the circuit structure of FIG. 3 is that of a mixer in single-ended configuration operating in subharmonic. The local oscillator signal LO/2 with subharmonic frequency injected to connector 7 passes in the following order through: glass-bead 5, pass-band section PBS, the short microstrip 15, metal strap 16, low-pass filter LPS and the pair of diodes D1, D2. As already known due to the nonlinearity of the conductivity of the diodes and to the high level of the local oscillator signal LO/2 with subharmonic frequency, the configuration of the diodes of FIG. 3 is such that a fundamental with double frequency compared to the subharmonic one is generated plus a certain number of even subharmonics. The reception radiofrequency signal RF present in the guide is directly injected into the cavity 2, which is equal to a part of the same guide for what concerns the propagation of the electromagnetic field. The signal RF injected in cavity reaches the diodes D1 and D2 where the beating with the fundamental and the following generation of the intermediate frequency signal IF happens. In a more general way the beating happens also with the subharmonic LO/2 and the harmonics even to the fundamental. Therefore the signal RF is transferred in frequency symmetrically around the above-mentioned frequencies, further than the fundamental.

The low pass filter LPS blocks all components generated in the diodes D1, D2 with the frequencies higher than the subharmonic preventing the latter ones from reaching the two sections PBS and LP of the diplexer filter. For this purpose the filter LPS carries a short circuit for said signals on the plan of the wall of cavity 2 passed through by the microstrip 18. The only signals passing completely the filter LPS are therefore the local oscillator signal LO/2 and the intermediate frequency IF. Also the beating between RF and LO/2 at the difference frequency passes, even if diminished, through the low pas filter LPS, but it will be blocked by both sections LP and PBS of the diplexer filter. The intermediate frequency signal IF generated in the diodes passes as follows through: filter LPS, strap 16, microstrip 15, low pass section LP, glass-bead 5 and comes out of connector 8.

In the diplexer filter the low pass section prevents the signal IF from joining the part of the local oscillator signal set up by the connector 7, and the low pass section LP prevents the local oscillator signal LO/2 from joining the part of the intermediate frequency signal set up by the connector B. According to what described before the function of the diplexer filter set up by the two sections PBS and LP, which is in fact that of isolating the part of the signal LO/2 from the signal IF and of isolating the part of the signal IF from the signal LO/2.

As already said, the isolations RF/(LO/2) and RF/IF the parts 7 and 8 are guarantied by the filter LPS. For what concerns instead the isolations (LO/2)/RF and IF/RF inside the guide these are assured by the fact that the same acts as a high pass filter which blocks the signals IF and LO/2.

Another aspect to be taken into consideration is the reduction of the losses caused by unwanted reflections of the signal RF because of the impedance missmatchings. In order to avoid this type of inconveniences the distance between the metal plate 12 which closes at the bottom cavity 2 setting up a short-circuit for the signal RF, and the reference plan of the diodes D1, D2 corresponding to the front side of the layer 14 must be such to carry an open circuit for the signal RF on said plan. Moreover the characteristic impedance $Z_G$ of the rectangular waveguide must coincide with the characteristic impedance $Z_{CAV}$ of cavity 2 including the contribution due to the impedance of the diodes; if this condition does not occur between the waveguide and cavity 2, then there will be introduced between the rectangular waveguide and cavity 2 a rectangular waveguide shaft is with a length equal to a quarter wave with reference to the centre band frequency of the signal RF and having characteristic impedance equal to:

$$Z_T = \sqrt{Z_G \cdot Z_{CAV}}$$

In the converter of the not limiting example just described before the signal RF has a centre band frequency of 55 GHz, the signal LO/2 has a frequency of 27 GHz and the signal turning out as IF has a centre band frequency of 1 GHz. The coaxial connectors 7 and 8 for the signals LO/2 and IF are of the type K, the rectangular waveguide for the signal RF is of the type WR 19 (UG-599 U), the used diodes are of the type GAAs Hp HSCH-9201. The electric performances are summarize in the following table:

| Band RF | 54– 60 GHz |
| --- | --- |
| Band of the fundamental | 52.5– 58.5 |
| Band IF | DC– 1.5 |
| Power dynamic of the fundamental | 10– 15 dBm |
| Conversion losses RF/IF | 10 dB typical |

The down-converter of the example operates also as an up-converter to obtain a transmission signal RF without the necessity to apply any modification to the described circuit structure, in that case the signal IF is incoming and the signal RF outgoing.

The functioning at lower frequencies requires an increase of the dimensions of the rectangular wave guide in addition to those of the converter, and therefore the lowering of the frequency turns out to be less convenient. Apart from this, whenever the use of the same structure is wanted, the quartz layer 14 may be realized by using a more convenient alumina layer.

Finally it is necessary to note that regarding the electric functioning of the converter the purpose of the cavities 4 and 3 (with the part 3') is to support the diplexer and LPS filters avoiding—once closed by the upper metal plate 11—the propagation of spurious radiation in the surrounding space. Completely different is the function of cavity 2 which, as already said, is equal to a section of the waveguide enabling the diodes placed in the centre to act as frequency mixers. Furthermore: cavity 2, the short-circuit plate 11, the diodes D1 and D2, the lines 18 and 19 without metallization below and the welding 21 set up a transfer from guide to microstrip, and vice versa.

What is claimed is:

1. Microwave subharmonic frequency converter comprising:

a diplexer filter in microstrip having one input port for a local oscillator signal with subharmonic frequency and an input or output part for an intermediate frequency signal, said filter being set up by a pass-band section and by a low pass section;

a second low pass filter realized in microstrip connected between a point common to both said sections of the diplexer filter and a couple of frequency mixer diodes, said second low pass filter letting go through said local oscillator signal with subharmonic frequency towards the diodes and blocking the frequencies higher than said subharmonic generated by the diodes, in this way isolating said ports of the local oscillator signal and intermediate frequency signal from a radiofrequency signal going through the diodes;

a waveguide with rectangular section which transports towards said mixer diodes the reception radiofrequency signal, or outwards said diodes the transmission radiofrequency signal respectively;

a metallic line deposed on a dielectric plate and without metallization below in correspondence of a zone opposite to the cross rectangular section of said waveguide, the metallic line being interrupted in the center where said diodes are connected in antiparallel to the heads of the interruption and between the second low pass filter and the ground;

a metal body including at least 2 contiguous cavities in which, a first one contains said diplexer filters and said second low pass filter, and a second one with a rectangular section goes through all the thickness of said metal body and extends to said waveguide which transports a reception radiofrequency signal towards said mixer diodes, or a vice versa, the diodes being placed along the center line of said second rectangular cavity in the sense of the shortest dimension;

a third small cavity which extends the first cavity beyond the second cavity for lodging one extremity of said dielectric plate supporting the diodes and to enable the soldering of one end of said interrupted metallic lines to a wall of the cavity;

a metal plate which closes completely said first and third cavities, and which closes on one side said second cavity setting up for the latter one a short-circuit plate.

2. Microwave frequency converter according to claim 1, wherein the distance between said metallic short circuit plate and the side of said dielectric plate on which said metallic line is deposed, is such to carry on said plate a circuit open for said radiofrequency signal.

3. Microwave frequency converter according to claim 1, wherein said interrupted metal line becomes a microstrip outside of said second cavity.

4. Microwave frequency converter according to claim 1, wherein the shortest dimension of the rectangular section of said second cavity is smaller than the corresponding dimension of said rectangular waveguide.

5. Microwave frequency converter according to the claims 1, wherein between said waveguide and said second cavity a waveguide shaft is inserted with rectangular section and length equal to a quarter wave with reference to the center band frequency of said radiofrequency signal and with the characteristic impedance $Z_T$ which satisfies the following expression:

$$Z_T = \sqrt{(Z_G \cdot Z_{CAV})}$$

where $Z_G$ is the characteristic impedance of said waveguide and $Z_{CAV}$ is the characteristic impedance of said second cavity including the contribution due to the impedance of said diodes.

6. Microwave frequency converter according to claim 1, wherein said dielectric plate is made of quartz.

7. Microwave frequency converter according to claim 6, wherein the converter works in the range of the millimeter radio waves.

8. Microwave frequency converter according to claim 1, wherein the ground plane of said dielectric plate is soldered to said metal body.

9. A frequency converter comprising:

a first low-pass filter;

a band-pass filter having a first end operatively connected to a first end of said first low-pass filter;

a second low-pass filter having a first end operatively connected to said first end of said first low-pass filter;

a first waveguide having a first end operatively connected to a second end of said second low-pass filter, said first waveguide containing at least one frequency-mixing element, said first waveguide continuing for a specific length after said at least one frequency-mixing element and having a second end that is operatively short circuited; and a second waveguide operatively connected to said at least one frequency-mixing element, wherein said specific length of said first waveguide extends past the operative connection between said second waveguide and said at least one frequency-mixing element.

10. The frequency converter of claim 9, further comprising:

a third waveguide having a first end connected to a second end of said first low-pass filter.

11. The frequency converter of claim 10, further comprising:

a fourth waveguide having a first end connected to a second end of said band-pass filter.

12. The frequency converter of claim 9, further comprising:

a fourth waveguide having a first end connected to a second end of said band-pass filter.

13. The frequency converter of claim 9, further comprising:

a first cavity enclosing said first waveguide but not enclosing said second waveguide.

14. The frequency converter of claim 13, wherein said second end of said first waveguide is short-circuited by being soldered to a wall of said first cavity.

15. The frequency converter of claim 13, wherein said frequency-mixing element comprises at least one pair of diodes having the anode of one diode connected to the cathode of the other diode and vice versa.

16. The frequency converter of claim 13, further comprising:

a second cavity enclosing said first low-pass filter and said band-pass filter.

17. The frequency converter of claim 13, further comprising:

a fifth waveguide connecting said second waveguide to said first cavity, wherein said fifth waveguide has a characteristic impedance that is the geometric average of the characteristic impedance of the second waveguide and the characteristic impedance of the first cavity, wherein the characteristic impedance of the first cavity includes a contribution due to said frequency-mixing element.

18. The frequency converter of claim 13, wherein said first waveguide includes a dielectric plate.

19. The frequency converter of claim 18, wherein said dielectric plate includes quartz.

20. The frequency converter of claim 19, wherein said converter is designed to work in the millimeter-wave range.

* * * * *

UNITED STATES PATENT AND TRADEMARK OFFICE
CERTIFICATE OF CORRECTION

PATENT NO. : 6,389,274 B1
DATED : May 14, 2002
INVENTOR(S) : Marco Piloni et al.

It is certified that error appears in the above-identified patent and that said Letters Patent is hereby corrected as shown below:

Title page,
Item [73], Assignee, please correct the assignee information from
"Italtel SPA, Milan (IT)" to -- Siemens Information and Communication Networks S.p.A., Milan (IT) --.

Signed and Sealed this

Twenty-ninth Day of October, 2002

Attest:

JAMES E. ROGAN
Attesting Officer
Director of the United States Patent and Trademark Office